United States Patent
Cho et al.

(10) Patent No.: US 6,552,337 B1
(45) Date of Patent: Apr. 22, 2003

(54) METHODS AND SYSTEMS FOR MEASURING MICROROUGHNESS OF A SUBSTRATE COMBINING PARTICLE COUNTER AND ATOMIC FORCE MICROSCOPE MEASUREMENTS

(75) Inventors: Kyoo-chul Cho, Kyungki-do (KR); Tae-Yeol Heo, Kyungki-do (KR); Jeong-hoon An, Kyungki-do (KR); Gi-jung Kim, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 142 days.

(21) Appl. No.: 09/688,283

(22) Filed: Oct. 13, 2000

(30) Foreign Application Priority Data

Nov. 2, 1999 (KR) ............................................. 99-48174

(51) Int. Cl.$^7$ .............................................. H01J 37/26
(52) U.S. Cl. ........................................ 250/307; 73/105
(58) Field of Search ............................. 250/307; 73/105

(56) References Cited

U.S. PATENT DOCUMENTS 5,533,387 A  *  7/1996 Aihara et al. .................. 73/105
5,581,082 A  * 12/1996 Hansma et al. ............. 250/306
5,633,455 A      5/1997 Quate ........................... 73/105
5,814,722 A  *  9/1998 Pratt et al. .................... 73/105

FOREIGN PATENT DOCUMENTS

EP              0 633 450 A2     6/1994

* cited by examiner

*Primary Examiner*—Bruce Anderson
*Assistant Examiner*—Zia R. Hashmi

(57) ABSTRACT

Embodiments of the present invention provide methods for measuring a wafer surface. A portion of the wafer surface is measured using a particle counter to provide first measurements corresponding to a plurality of points on the wafer surface. A selected area of the wafer surface including one of the plurality of points is measured using an atomic force microscope (AFM) to provide a microroughness measurement of the selected area. The selected area is a localized area of the portion of the wafer surface measured using the particle counter. The first measurements and the microroughness measurement are provided as a measurement of the wafer surface. The portion measured using a particle counter may, for example, be substantially the entire wafer surface.

18 Claims, 3 Drawing Sheets

METHODS AND SYSTEMS FOR MEASURING MICROROUGHNESS OF A SUBSTRATE COMBINING PARTICLE COUNTER AND ATOMIC FORCE MICROSCOPE MEASUREMENTS

RELATED APPLICATIONS

This application is related to Korean Application No. 9948174, filed Nov. 2, 1999 the disclosure of which is hereby incorporated herein by reference.

BACKGROUND OF THE INVENTION

The present invention relates to a wafer surface evaluation, and more particularly, to methods and systems for measuring the microroughness of a semiconductor wafer surface.

Semiconductor devices are generally fabricated on the surface of an underlying silicon wafer substrate. Accordingly, it is generally desirable for regions on a wafer surface which will be fabricated to become an active region including such devices to have a high degree of surface flatness. The move towards semiconductor devices having a high integration density and a small feature size further increases the desirability of providing a semiconductor wafer having a high degree of surface flatness also referred to as a low microroughness. It is further desirable for semiconductor wafers used in the manufacture of semiconductor devices to have both a generally uniform degree of surface flatness over the wafer and a reduced average size of roughness.

By way of example, with the reduction in size of devices, such as transistors, which are formed on a semiconductor wafer, a thinner gate dielectric film is generally needed between a gate electrode and the wafer to achieve a desired performance of the transistor. More particularly, even though the thickness of the gate dielectric film typically must be reduced, it is desirable to maintain the electrical properties thereof, such as breakdown voltage strength. In order to meet these design requirements, there is a generally a need to minimize the microroughness of the surface of the semiconductor wafer, especially at the interface between the gate dielectric film and the semiconductor wafer. For example, for a gate dielectric film having a thickness of 50 angstroms (Å) to achieve a desired performance, any roughness that is on the order of a few Å is generally not acceptable and must be removed. To provide such control, methods and systems which provide for effective measurement and controlling of the microroughness of the surface of a semiconductor wafer are desirable.

Atomic force microscopes (AFMs) are often used to measure the microroughness of wafer surfaces. An AFM generally measures the microroughness of a wafer surface by moving an atom-sized measuring probe along the surface of the wafer for detecting microscopic forces, typically Van der Waals forces, exerted between atoms of the wafer surface and the probe, and detecting changes in such forces due to minute differences in the distances between the atoms and the probe. For microroughness measurement using a typical AFM, a predetermined fixed dimension of a sample, for example, 0.1 micrometer ($\mu$m) by 0.1 $\mu$m, 1 $\mu$m by 1 $\mu$m, or 10 $\mu$m by 10 $\mu$m, is determined as a scanning area and several points are detected within the scanning area. The microroughness obtained by the AFM is usually represented by the root mean square (RMS) average of the detected points.

The use of the AFM in measuring the microroughness of a wafer surface may provide a highly accurate result without destruction of the wafer surface. However, the RMS value may vary depending on the dimension of scanning area and the kind of atoms present on the wafer. That is, the results of an AFM measurement may vary according to the dimensions of the scanning area. In addition, because the dimensions of the scanning area are typically very small relative to the wafer size, the measurement result may not represent the microroughness with respect to the entire wafer which may limit the correspondence of the measured results to the overall wafer surface configuration. Further, because this method is typically slow, microroughness measurement by the AFM may not be suitable for real-time (during manufacture) controlling of the microroughness of a semiconductor wafer.

Another existing technique available for measuring the microroughness of a wafer surface is to measure haze levels using a particle counter. Particle counters typically use a light source to reflect light off the wafer surface and measure the scattering of the light resulting from the microroughness of the wafer surface. Such a measure of the scattering of the light may be used as a measure of the microroughness of the wafer surface. Thus, haze levels from a particle counter may be used as an indicator of microroughness using optical methods. A higher haze level generally indicates that the wafer surface is more rough.

In the measurement of haze levels with a particle counter, the wafer surface is typically not in direct contact with a measuring device, and the measuring speed may be faster compared to measuring using an AFM. Typically, for haze level measurement of a wafer surface, a plurality of haze levels are measured for a particular area over the wafer and the average haze level is calculated to represent the haze level for the particular area. In other words, the haze level for a particular area may be expressed as one average value which limits the haze level output with respect to the particular area to a single value. Also, the haze level for a localized area of selected dimensions within the particular area may not be separately characterized by a measurement. Thus, the haze level obtained may not provide a complete characterization of the microroughness of the wafer surface during the manufacture of semiconductor devices.

SUMMARY OF THE INVENTION

Embodiments of the present invention provide methods for measuring a wafer surface. A portion of the wafer surface is measured using a particle counter to provide first measurements corresponding to a plurality of points on the wafer surface. A selected area of the wafer surface including one of the plurality of points is measured using an atomic force microscope (AFM) to provide a microroughness measurement of the selected area. The selected area may be a localized area of the portion of the wafer surface measured using the particle counter. The first measurements and the microroughness measurement are provided as a measurement of the wafer surface.

In other embodiments of the present invention, operations further include formatting the microroughness measurement of the selected area as a 3-dimensional image. The 3-dimensional image is provided as a measurement of the wafer surface. The portion of the wafer surface measured by the particle counter may be substantially all of the portion of the wafer surface to be used as active regions. The first measurements may be provided as a measurement of the microroughness of the entire wafer surface and the 3-dimensional image may be provided as a microroughness uniformity measurement of the wafer surface.

In further embodiments of the present invention, the AFM measurement operations are preceded by mapping the selected point from a first coordinate system associated with the particle counter to the selected area in a second coordinate system associated with the AFM. Mapping operations may include determining a coordinate value in the first coordinate system of the one of the plurality of points and identifying, by a plurality of defining second coordinate values in the first coordinate system, a 2-dimensional localized area enclosing the first point. The plurality of second coordinate values in the first coordinate system are converted to corresponding coordinate values in the second coordinate system to define the selected area. The first coordinate system may be a X-Y stage coordinate system of the particle counter and the second coordinate system may be a X-Y stage coordinate system of the AFM.

In other embodiments of the present invention, the particle counter measurement operations include irradiating light onto the wafer surface. Light scattered from the wafer surface is measured. A haze level is calculated over the wafer surface as the first measurements based on a variation in an amount of light scattered from the wafer surface. The measured light may be light scattered from a dark field section of the irradiated light.

In further embodiments, the selected area is about 5 micrometers by 5 micrometers. The AFM measurement operations may include determining either a root mean square (RMS) or a peak-to-valley (P-V) output value as the microroughness measurement.

In yet further embodiments of the present invention, systems are provided for measuring a wafer surface. A particle counter measures a portion, such as substantially the entirety, of the wafer surface to provide first measurements corresponding to a plurality of points on the wafer surface. An atomic force microscope (AFM) measures a selected area of the wafer surface including one of the points to provide a microroughness measurement of the selected area. The selected area is a localized area of the at least a portion of the wafer surface measured by the particle counter. A controller maps the selected point from a first coordinate system associated with the particle counter to the selected area in a second coordinate system associated with the AFM. The controller further provides the first measurements and the microroughness measurement as a measurement of the wafer surface.

In other embodiments of the present invention, methods are provided for measuring the microroughness of a wafer surface. A haze map of the wafer surface is prepared using a particle counter having a X-Y stage coordinate system. A first coordinate value associated with a position of a first point selected from the haze map is determined. A 2-dimensional localized area enclosing the first point is determined. A plurality of second coordinate values which define the localized area are determined. The first coordinate value and the plurality of second coordinate values are converted into corresponding coordinate values on a X-Y stage coordinate system of an atomic force microscope (AFM) by coordinate linking. The corresponding coordinate values enable the X-Y stage coordinate system of the AFM to locate the 2-dimensional localized area enclosing the first point. The microroughness of the wafer surface of the 2-dimensional localized area enclosing the first point is measured using the AFM based on the corresponding coordinate values input to the X-Y stage coordinate system of the AFM.

Using the microroughness measurement methods and systems of the present invention, the microroughness within a localized area of a wafer may be accurately measured and, in various embodiments, may be shown as a 3-dimensional image. Thus, the inventive method may be utilized in the manufacture of high density integrated circuits, where tight and accurate microroughness control is desired.

BRIEF DESCRIPTION OF THE DRAWINGS

The above objective and advantages of the present invention will become more apparent by describing embodiments thereof with reference to the following accompanying drawings.

DETAILED DESCRIPTION OF THE INVENTION

Figure 1:
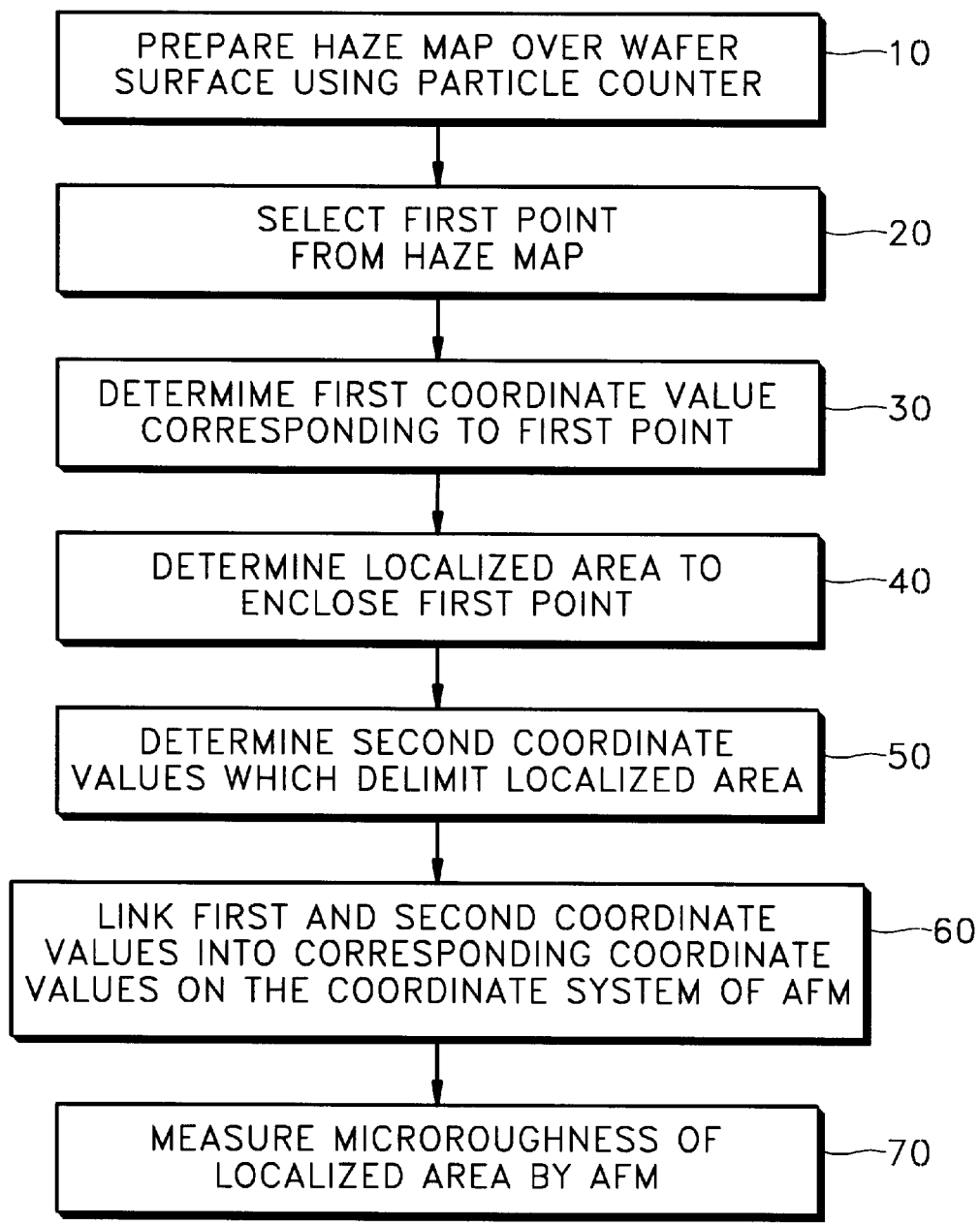
FIG. 1 is a flowchart illustrating methods for measuring the microroughness of a wafer according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As will be appreciated by one of skill in the art, the present invention may be embodied as a method, system, or computer program product. Accordingly, the present invention may take the form of an entirely hardware embodiment, an entirely software embodiment or an embodiment combining software and hardware aspects. Furthermore, the present invention may take the form of a computer program product on a computer-usable storage medium having computer-usable program code means embodied in the medium. Any suitable computer readable medium may be utilized including hard disks, CD-ROMs, optical storage devices, a transmission media such as those supporting the Internet or an intranet, or magnetic storage devices.

Computer program code for carrying out operations of the present invention may be written in an object oriented programming language such as Java®, Smalltalk or C++. However, the computer program code for carrying out operations of the present invention may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart and/or block diagram block or blocks. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Particles on the surface of a wafer have been commonly counted using a scatterometric particle measurement system which typically detects the particles based on a light scattering phenomenon. Examples of systems for detecting particles and measuring haze levels of a wafer include particle counters such as the Surfscan SP1 TB1 (manufactured by KLA-Tencor Corporation, USA) or the Advanced Wafer Inspection System (AWIS) (manufactured by ADE Optical Systems Corporation, USA). Such particle counters, and analysis systems such as an atomic force microscope (AFM), generally include a coordinate system, such as an X-Y stage, and perform scattermetry with respect to coordinates on the X-Y stage, which is known to adopt the X-Y coordinate system. According to various embodiments of the present invention, using coordinate linking between the coordinate systems of a particle counter and an AFM, and the area navigation function of the AFM, the microroughness of a wafer within a localized area may be measured in 3-dimensions.

FIG. 1 is a flowchart illustrating methods for measuring the microroughness of a wafer surface according to embodiments of the present invention. Referring to FIG. 1, operations for embodiments using a common particle counter employing the X-Y coordinate system, such as the Surfscan SP1 TBI or the AWIS will be described. Using the particle counter, a haze map of the surface of a target wafer is prepared (block 10).

For preparation of the haze map, a light beam may be irradiated onto a particular point of the target wafer. Light scattered from a dark field section may then be measured. Based on the variation in light scattering, the haze level for the particular point may be determined. The haze levels may be measured over the entire wafer and then mapped as a haze map.

After the haze distribution over a portion of the wafers such as substantially the entire wafer, is found based on the haze map, an area a user desires to further inspect the microroughness of is selected from the haze map, and one point is selected from the area (block 20). A coordinate value ($x_0$, $y_0$) on the X-Y stage of the particle counter is determined for the position of the selected point (block 30). A range of a localized area for microroughness measurement is determined around the coordinate ($x_0$, $y_0$) of the selected point (block 40). For example, a rectangular area having a dimension of 5 μm by 5 μm around the coordinate of the selected point, may be defined as a localized area. A plurality of second coordinate values are determined to delimit the localized area (block 50). In particular, the coordinates for the vertices of the rectangular region defined as the localized area, ($x_1$, $y_1$), ($x_2$, $y_2$), ($x_3$, $y_3$) and ($x_4$, $y_4$), may be determined. The five coordinates ($x_0$, $y_0$), ($x_1$, $y_1$), ($x_2$, $y_2$), ($x_3$, $y_3$) and ($x_4$, $y_4$) on the X-Y stage of the particle counter are linked to the X-Y stage coordinate system of the AFM to convert the coordinates into coordinates suitable for the X-Y stage coordinate system of the AFM, ($X_0$, $Y_0$), ($X_1$, $Y_1$), ($X_2$, $Y_2$), ($X_3$, $Y_3$) and ($X_4$, $Y_4$), respectively (block 60). The coordinates ($X_0$, $Y_0$), ($X_1$, $Y_1$), ($X_2$, $Y_2$), ($X_3$, $Y_3$) and ($X_4$, $Y_4$) may be found using the navigation function of the AFM. The microroughness with respect to the localized area delimited by the coordinates ($X_0$, $Y_0$), ($X_1$, $Y_1$), ($X_2$, $Y_2$), ($X_3$, $Y_3$) and ($X_4$, $Y_4$) is measured using the AFM (block 70).

The results obtained by the AFM may be expressed as root mean squares (RMSs) or peak-to-valley (P-V). Assuming that the height from a reference plane to N measuring points is $x_i$, where i=1, 2, ..., N, the RMS may be described by the following $$RMS = \sqrt{\frac{\sum_{i=1}^{N}(x_i - \bar{x})^2}{N}} \quad (1)$$

where $\bar{x}$ is:

$$\bar{x} = \sum_{i=1}^{N} \frac{x_i}{N} \quad (2)$$

The P-V may be described by the following:

$$P\text{-}V = [x_i]_{max} - [x_i]_{min} \quad (3)$$

where $[x_i]_{max}$ is the maximum value of $x_i$ and $[x_i]_{min}$ is the minimum value of $x_i$.

Thus, the haze level distribution is first determined by forming a haze map with respect to for example, substantially the entire surface of a wafer using a particle counter. A desired localized area is selected based on the haze level distribution. The microroughness for the localized area is then further, and potentially more accurately, measured using the AFM. The microroughness with respect to a particular localized area can be identified as a 3-dimensional image.

Figure 2:
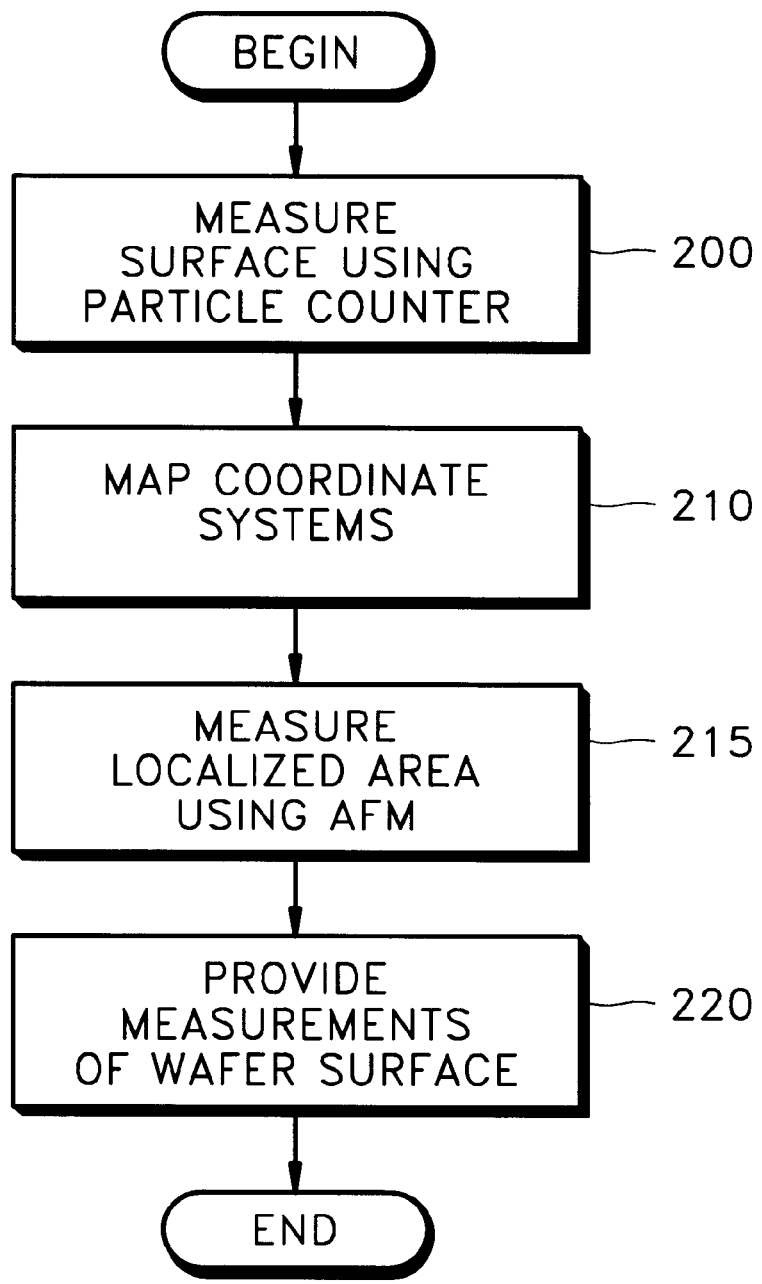
FIG. 2 is a flowchart illustrating methods for measuring a wafer surface according to embodiments of the present invention.

Operations according to further embodiments of methods for measuring a wafer surface will now be described with reference to the flowchart diagram illustration of FIG. 2. Operations begin at block 200 when a portion of the wafer surface is measured using a particle counter to provide first measurements corresponding to a plurality of points on the wafer surface. The portion of the wafer surface measured using the particle counter at block 200 may be substantially all of the portion of the wafer surface to be used as active regions. This may include substantially the entire wafer surface. The measurements by the particle counter may be generated, for example, by irradiating light onto the wafer surface, measuring light scattered from the wafer surface responsive to the irradiated light and calculating a haze level of the wafer surface as the particle counter measurements based on a variation in the amount of light scattered from the wafer surface.

In various embodiments of the present invention, measuring the wafer surface using a particle counter is followed by mapping one of the measured points on the wafer surface from a first coordinate system associated with the particle counter to a localized selected area defined in a second coordinate system associated with an atomic force microscope (AFM) (block 210). Similar to the embodiments described with reference to FIG. 1, mapping operations at block 210 may include determining a coordinate value in the first coordinate system for one of the measured points, identifying a plurality of second coordinate values in the first coordinate system defining a two-dimensional localized area enclosing the first point and converting a plurality of second coordinate values to a corresponding coordinate value set in the second coordinate system to define the localized area. The first coordinate system may be an X-Y stage coordinate system of the particle counter and the second coordinate system may be an X-Y stage coordinate system of the AFM.

The selected localized area of the wafer surface including one of the points measured using the particle counter is measured using the AFM to provide a microroughness measurement of the localized area (block 215). The first measurements and the microroughness measurement are provided as a measurement of the wafer surface (block 220). In various embodiments, the microroughness measurement of the localized area from the AFM is formatted as a 3-dimensional image. In further embodiments, operations at block 220 may include providing the first measurements from the particle counter as a measurement of the microroughness of the entire wafer surface and the 3-dimensional image from the AFM as a microroughness uniformity measurement of the wafer surface.

Figure 3:
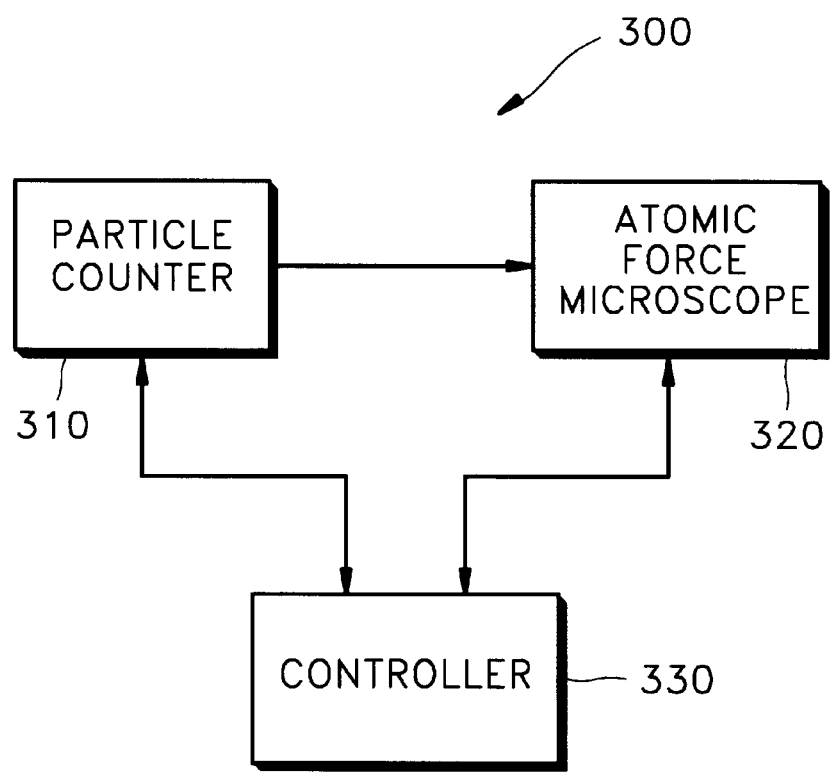
FIG. 3 is a block diagram illustrating a system for measuring a wafer surface according to embodiments of the present invention.

Referring now to the block diagram illustration of FIG. 3, embodiments of a system for measuring a wafer surface according to the present invention will now be further described. The system 300 includes a particle counter 310 that measures at least a portion of the wafer surface, such as the entire surface, to provide first measurements corresponding to a plurality of points on the wafer surface. An atomic force microscope (AFM) 320 measures a selected area of the wafer surface, including one of the points measured by the particle counter 310, to provide a microroughness measurement of the selected area. The selected area is a localized area of the portion of the wafer surface measured by the particle counter 310.

A controller 330 maps one of the points measured by the particle counter from a first coordinate system associated with the particle counter 310 to the selected area in a second coordinate system associated with the AFM 320. The controller 330 further provides the first measurements and the microroughness measurement as a measurement of the wafer surface. The first coordinate system may be an X-Y stage coordinate system of the particle counter 310 and the second coordinate system may be an X-Y stage coordinate system of the AFM 320.

Although the present embodiment is described above generally with reference to a silicon wafer, the present invention may also be used for measuring transparent substrates or any flat substrate. In addition, the microroughness measuring method of the present invention may be applied at a variety of stages during the manufacture of semiconductor devices. For example, after a chemical mechanical polishing process, which typically needs precise microroughness control, the microroughness measuring method of the present invention may be beneficially utilized. Also, the inventive method may be effective during the manufacture of high density integrated devices, which typically requires more accurate and tight microroughness control.

In addition, the use of the navigation function of the AFM may enable very fine microroughness of a wafer, within a localized area, to be measured with a higher accuracy than is typically detected by a common particle counter. Also, the microroughness measuring methods of the present invention may allow for real time monitoring during the manufacture of such semiconductor devices.

In the drawings and specification, there have been disclosed typical preferred embodiments of the invention and, although specific terms are employed, they are used in a generic and descriptive sense only and not for purposed of limitation, the scope of the invention being set forth in the following claims.

What is claimed is:

1. A method for measuring roughness of a wafer surface comprising:

measuring at least a portion of the wafer surface using a particle counter to provide first measurements corresponding to a plurality of points on the wafer surface;

measuring a selected area of the wafer surface including one of the plurality of points using an atomic force microscope (AFM), after measuring at least a portion of the wafer surface using a particle counter to provide the first measurements, to provide a microroughness measurement of the selected area, the selected area being a localized area of the at least a portion of the wafer surface measured using a particle counter; and providing the first measurements and the microroughness measurement associated with the included one of the plurality of points as a measurement of the wafer surface.

2. The method of claim 1 further including the step of formatting the microroughness measurement of the selected area as a 3-dimensional image and wherein the step of providing the first measurements and the microroughness measurement as a measurement of the wafer surface further comprises the step of providing the 3-dimensional image as a measurement of the wafer surface.

3. The method of claim 2 wherein the at least a portion of the wafer surface comprises substantially all of the portion of the wafer surface to be used as active regions and wherein the step of providing the first measurements and the microroughness measurement as a measurement of the wafer surface further comprises the step of providing the first measurements as a measurement of the microroughness of the entire wafer surface and the 3-dimensional image as a microroughness uniformity measurement of the wafer surface.

4. The method of claim 1 wherein the step of measuring a selected area of the wafer surface including one of the plurality of points using an atomic force microscope is preceded by the step of mapping the one of the plurality of points from a first coordinate system associated with the particle counter to the selected area in a second coordinate system associated with the AFM.

5. The method of claim 4 wherein the mapping step comprises the steps of:

determining a coordinate value in the first coordinate system of the one of the plurality of points;

identifying a plurality of second coordinate values in the first coordinate system defining a 2-dimensional localized area enclosing the first point; and converting the plurality of second coordinate values in the first coordinate system to corresponding coordinate values in the second coordinate system to define the selected area.

6. The method of claim 5 wherein the first coordinate system is a X-Y stage coordinate system of the particle counter and the second coordinate system is a X-Y stage coordinate system of the AFM.

7. The method of claim 6 wherein the step of measuring at least a portion of the wafer surface using a particle counter includes the steps of:

irradiating light onto the wafer surface;

measuring light scattered from the wafer surface; and calculating a haze level over the wafer surface as the first measurements based on a variation in an amount of light scattered from the wafer surface.

8. The method of claim 7 wherein the step of measuring light scattered from the wafer surface further comprises the step of measuring light scattered from a dark field section of the irradiated light.

9. The method of claim 6 wherein the selected area is about 5 micrometers by 5 micrometers.

10. The method of claim 6 wherein the step of measuring the selected area of the wafer surface further comprises the step of determining at least one of a root mean square (RMS) or a peak-to-valley (P-V) output value as the microroughness measurement.

11. The method of claim 10 wherein the at least a portion of the wafer surface comprises substantially the entire wafer surface.

12. A method for measuring the microroughness of a wafer surface, comprising the steps of:

(a) preparing a haze map of the wafer surface using a particle counter having a X-Y stage coordinate system;

(b) determining a first coordinate value associated with a position of a first point selected from the haze map;

(c) determining a 2-dimensional localized area enclosing the first point;

(d) determining a plurality of second coordinate values which define the localized area;

(e) converting the first coordinate value and the plurality of second coordinate values into corresponding coordinate values on a X-Y stage coordinate system of an atomic force microscope (AFM) by coordinate linking, wherein the corresponding coordinate values enable the X-Y stage coordinate system of the AFM to locate the 2-dimensional localized area enclosing the first point; and (f) measuring the microroughness of the wafer surface of the 2-dimensional localized area enclosing the first point using the AFM based on the corresponding coordinate values input to the X-Y stage coordinate system of the AFM.

13. The method of claim 12 wherein the step of preparing a haze map includes the steps of:

irradiating a light beam onto the wafer surface;

measuring light scattered from the wafer surface; and calculating a haze level over the wafer surface based on a variation in an amount of scattered light measured to provide the haze map.

14. The method of claim 13 wherein the step of measuring light scattered from the wafer surface further comprises the step of measuring light scattered from a dark field section of the light beam.

15. A system for measuring roughness of a wafer surface comprising:

a particle counter that measures at least a portion of the wafer surface to provide first measurements corresponding to a plurality of points on the wafer surface;

an atomic force microscope (AFM) that measures a selected area of the wafer surface including one of the plurality of points to provide a microroughness measurement of the selected area, the selected area being a localized area of the at least a portion of the wafer surface measured by the particle counter; and a controller that maps the one of the plurality of points from a first coordinate system associated with the particle counter to the selected area in a second coordinate system associated with the AFM and provides the first measurements and the microroughness measurement as a measurement of the wafer surface.

16. The system of claim 15 wherein the first coordinate system is a X-Y stage coordinate system of the particle counter and the second coordinate system is a X-Y stage coordinate system of the AFM.

17. The system of claim 16 wherein the controller further comprises:

means for determining a coordinate value in the first coordinate system of the one of the plurality of points;

means for identifying by a plurality of second coordinate values in the first coordinate system defining a 2-dimensional localized area enclosing the first point; and means for converting the plurality of second coordinate values in the first coordinate system to corresponding coordinate values in the second coordinate system to define the selected area.

18. A method for measuring roughness of a wafer surface comprising:

measuring scattering of light from at least a portion of the wafer surface to provide a haze map including first measurements corresponding to a plurality of points on the wafer surface;

measuring a selected area of the wafer surface including one of the plurality of points using an atomic force microscope (AFM) to provide a microroughness measurement of the selected area, the selected area being a localized area of the at least a portion of the wafer surface measured using a particle counter; and providing the first measurements and the microroughness measurement associated with the included one of the plurality of points as a measurement of the wafer surface.

* * * * *

UNITED STATES PATENT AND TRADEMARK OFFICE
CERTIFICATE OF CORRECTION

PATENT NO.    : 6,552,337 B1
DATED         : April 22, 2003
INVENTOR(S)   : Cho et al.

It is certified that error appears in the above-identified patent and that said Letters Patent is hereby corrected as shown below:

<u>Title page,</u>
Please add item -- [74] *Attorney, Agent, or Firm* - Myers Bigel Sibley & Sajovec --

<u>Column 9,</u>
Line 43, should read -- (f) measuring the microroughness of the water surface of --

Signed and Sealed this

Twenty-third Day of March, 2004

JON W. DUDAS
*Acting Director of the United States Patent and Trademark Office*